United States Patent [19]

Mochida et al.

[11] Patent Number: 5,386,936
[45] Date of Patent: Feb. 7, 1995

[54] WIRE BONDING METHOD

[75] Inventors: Tooru Mochida, Oume; Yoshimitsu Terakado, Hachioji, both of Japan

[73] Assignee: Kabushiki Kaisha Shinkawa, Tokyo, Japan

[21] Appl. No.: 105,514

[22] Filed: Aug. 11, 1993

[30] Foreign Application Priority Data

Aug. 12, 1992 [JP] Japan .................................. 4-236382

[51] Int. Cl.$^6$ ............................................. B23K 20/10
[52] U.S. Cl. ................................. 228/102; 228/110.1
[58] Field of Search ................... 228/102, 110.1, 180.5

[56] References Cited

U.S. PATENT DOCUMENTS 5,046,654 9/1991 Yamazaki et al. .................. 228/102
5,199,630 4/1993 Felber et al. ........................ 228/102

FOREIGN PATENT DOCUMENTS

298611-A5 3/1992 Germany ......................... 228/110.1
2-119154 5/1990 Japan .
575190 11/1977 U.S.S.R. ........................... 228/110.1

Primary Examiner—P. Austin Bradley
Assistant Examiner—Jeffrey T. Knapp
Attorney, Agent, or Firm—Koda and Androlia

[57] ABSTRACT

A wire bonding method used in a bonding apparatus manufacturing, for example, semiconductor devices makes a correction of the ultrasonic output of a transducer using one of three correction timing patterns: a first correction timing pattern which makes the ultrasonic output correction prior to a first bonding by a first bonding wire to a single IC device, a second correction timing pattern which makes the output correction prior to a first bonding by a bonding wire, and a third correction timing pattern which makes the output correction prior to a first bonding and prior to a second bonding. By selecting one of the three patterns, the ultrasonic oscillation output is corrected at an appropriate timing regardless of the differences in the characteristics of the transducers used.

2 Claims, 2 Drawing Sheets

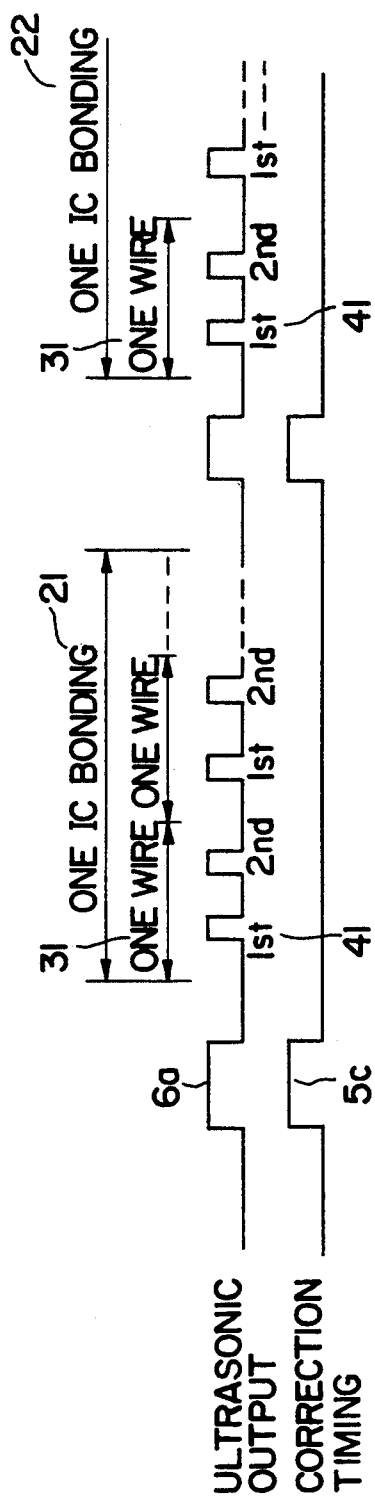
FIG. I(a)
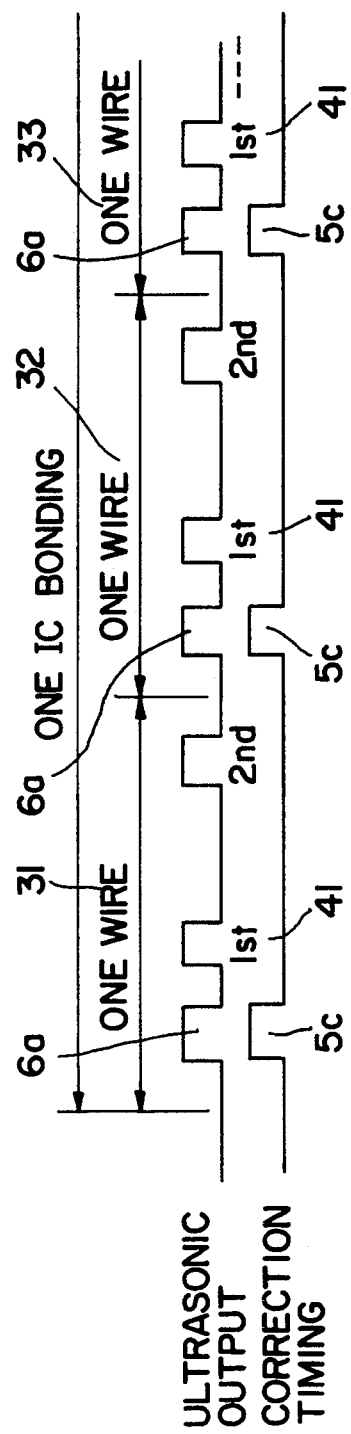
FIG. I(b)
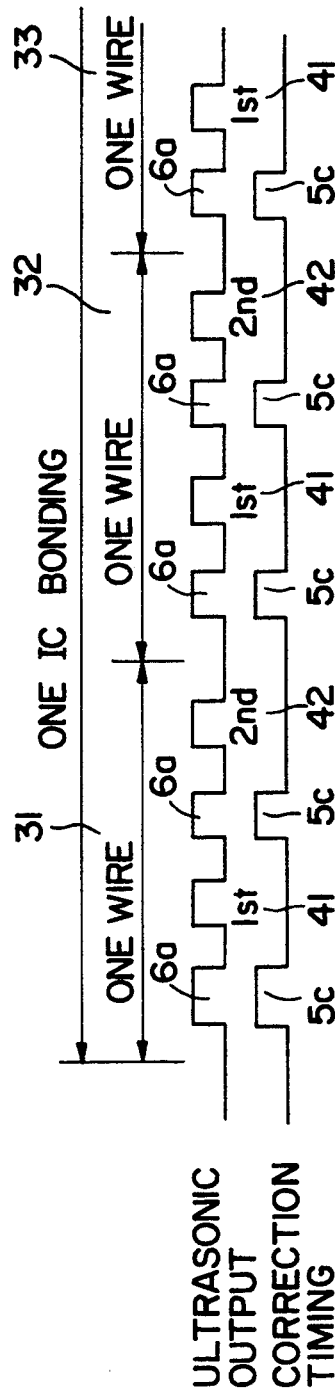
FIG. I(c)

WIRE BONDING METHOD

BACKGROUND OF THE INVENTION

1. Field of the Invention

The present invention relates to a wire bonding method and more particularly to a method for correcting the ultrasonic oscillation output of a transducer.

2. Prior Art

Japanese Patent Application Laid-Open (Kokai) No. 2-119154 discloses one of ultrasonic oscillation systems for transducers used in wire bonding.

In this system, a constant ultrasonic oscillation is obtained under the same bonding condition regardless of differences in the characteristics of the transducers used. A correction method for obtaining such a constant ultrasonic oscillation utilized in this system will be described with reference to FIG. 2.

As shown in FIG. 2, electric current 1a which is fed back from a transducer 1 is amplified by a current amplifier 8 of an ultrasonic oscillation control circuit 4. The transducer 1 has a bonding tool 2, and a bonding wire 3 passes through the bonding tool 2. The resulting amplified current 8a is converted into digital current data 10a by an A/D converter 10, and this data 10a is inputted into a microcomputer 5.

The microcomputer 5 calculates differences in the characteristics of the transducer 1 and outputs ultrasonic oscillation output data 5a to an output control circuit 11. This output data 5a has been corrected so that an ultrasonic oscillation, that is the same as one which is established by manual input data setting or by data transfer setting, is obtained.

Electric current 8a and output voltage 7a of a power amplifier 7 are inputted into a phase detection circuit 9. The phase detection circuit 9 reads the voltage phase and the current phase and outputs a voltage 9a (which is proportional to the phase shift) to an ultrasonic oscillation circuit 6.

The ultrasonic oscillation circuit 6 outputs an ultrasonic oscillation voltage 6a to output control circuit 11. The ultrasonic oscillation voltage 6a performs ultrasonic oscillation in which the transducer 1 synchronizes on the basis of the voltage 9a that corresponds to the phase shift. The output control circuit 11 controls the ultrasonic oscillation voltage 6a, which is inputted from the ultrasonic oscillation circuit 6, in accordance with the ultrasonic oscillation output data 5a and outputs the voltage to the transducer 1 via the power amplifier 7.

Thus, since the voltage applied to the transducer 1 is corrected according to the output voltage 7a, equal oscillation amplitude is obtained even if the oscillation characteristics of the transducer 1, that includes a transducer supporting member, is different. Accordingly, as long as the data input setting is the same, the same or equal bonding strength can be obtained in different wire bonding devices. Furthermore, since the bonding can be done evenly to any workpiece, there is bonding interchangeability, and data transfer between different wire bonding apparatuses becomes possible.

Thus, the above-described prior art discloses a method to correct the ultrasonic oscillation output in order to correct the differences in the transducer characteristics. However, no particular consideration is given to timings or when the ultrasonic oscillation output correction should be performed.

SUMMARY OF THE INVENTION

The object of the present invention is to provide a wire bonding method in which the timing of the ultrasonic oscillation output is stored in a memory beforehand, so that the ultrasonic oscillation output is automatically corrected in accordance with the timing.

In order to accomplish the objects, the present invention uses a unique structure for a wire bonding method to correct ultrasonic oscillation output so that differences in the transducer characteristics are compensated, and the unique structure is that three correction timing patterns are established and stored beforehand in a memory so that the ultrasonic oscillation output is automatically corrected by selecting one of the three correction timing patterns. The three patterns comprise:

(a) a first correction timing pattern by which a correction is performed prior to a first bonding by a first bonding wire in the bonding of an IC device;

(b) a second correction timing pattern by which a correction is performed prior to a first bonding by each bonding wire; and (c) a third correction timing pattern in which respective corrections are performed prior to a first bonding and a second bonding which is done by each bonding wire.

If the first correction timing pattern is selected, the ultrasonic oscillation output is corrected prior to the initiation of wire bonding to the first bonding point by a first bonding wire of an IC device. If the second correction timing pattern is selected, the ultrasonic oscillation output is corrected prior to the initiation of wire bonding to a first bonding point by each bonding wire. If the third correction timing pattern is selected, respective corrections of the ultrasonic oscillation output are performed prior to wire bonding to a first bonding point and prior to wire bonding to a second bonding point which are done by each bonding wire.

Of the above three patterns, only one of the two patterns (b) and (c) can be used along with the pattern (a).

BRIEF DESCRIPTION OF THE DRAWINGS

FIGS. 1(a), 1(b) and 1(c) show three correction timing patterns according to the wire bonding method of the present invention.

DETAILED DESCRIPTION OF THE INVENTION

Figure 2:
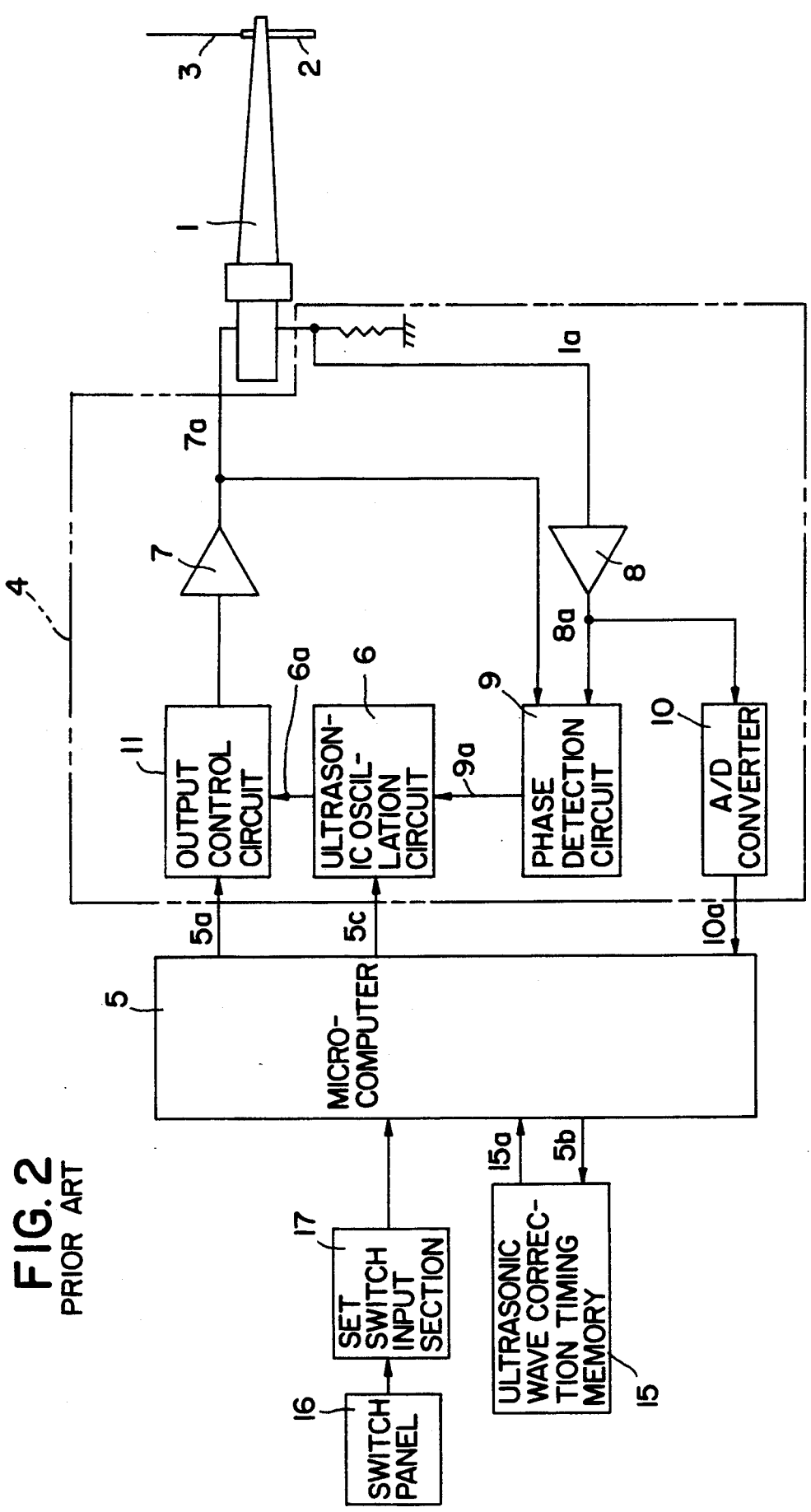
FIG. 2 is a circuit diagram used in the method of the present invention.

One embodiment of the present invention will be described below with reference to FIGS. 1 and 2.

Three correction timing patterns for the ultrasonic oscillation output of a transducer are established and stored in an ultrasonic wave correction timing memory 15 as shown in FIG. 2.

The first correction timing pattern is established for each IC device. With this timing pattern, the ultrasonic oscillation output is corrected prior to the initiation of wire bonding to a first bonding point that is done by a first bonding wire on an IC device which is mounted to a lead frame and set on a bonding stage. This correction timing pattern is referred to as a "correction timing pattern on IC device".

The second correction timing pattern is established for each bonding wire. In this case, the ultrasonic oscillation output is corrected prior to the initiation of wire bonding to a first bonding point by a bonding wire. This correction timing pattern is referred to as a "correction timing pattern on bonding wire".

The third correction timing pattern is established for each bonding point. In this case, the ultrasonic oscillation output is corrected prior to wire bonding to a first bonding point and prior to wire bonding to a second bonding point which are done by a bonding wire. This correction timing pattern is referred to as a "correction timing pattern on bonding point".

When the correction timing patterns stored in the ultrasonic wave correction timing memory 15 are selected via switches of a switch panel 16, the switch that is selected is read by a microcomputer 5 via a set switch input section 17. The microcomputer 5 ascertains which switch has been selected and sends a switch selection signal 5b to the ultrasonic wave correction timing memory 15. In accordance with the selected correction timing pattern, the ultrasonic wave correction timing memory 15 outputs a correction initiation command signal 15a to the microcomputer 5 at the time that each correction is to be performed. As a result of this, the microcomputer 5 outputs a correction timing signal 5c to the ultrasonic oscillation circuit 6. The selection of the correction timing pattern via the switch panel 16 is performed prior to the starting of the wire bonding apparatus.

Below, each case in which one of the three correction timing patterns is selected will be described:

FIG. 1(a) shows the case of the "correction timing pattern on IC device" being selected. If this selection is made, the correction initiation command signal 15a is outputted to the microcomputer 5 from the ultrasonic wave correction timing memory 15 prior to the initiation of the wire bonding 41 to a first bonding point (hereafter, wire bonding to the first bonding point will be referred to as the "first bonding") by a first bonding wire 31 for each IC bonding operation 21, 22, . . . Accordingly, the correction timing signal 5c is outputted to the ultrasonic oscillation circuit 6 from the microcomputer 5, and the ultrasonic oscillation circuit 6 outputs an ultrasonic oscillation voltage 6a which is corrected in the same way as in the prior art. Then, using this corrected ultrasonic oscillation output, the bonding 21, 22, . . . on each IC device is performed by the ultrasonic oscillation output which is suitable for the first bonding 41 and the second bonding 42 (i.e., wire bonding to the second bonding point).

FIG. 1(b) shows the selection of the "correction timing pattern on bonding wire". If this selection is made, the correction initiation command signal 15a is outputted to the microcomputer 5 from the ultrasonic wave correction timing memory 15 prior to the initiation of the first bonding 41 by each bonding wire 31, 32, 33, . . . . Accordingly, the correction timing signal 5c is outputted to the ultrasonic oscillation circuit 6 from the microcomputer 5, and the ultrasonic oscillation circuit 6 outputs an ultrasonic oscillation voltage 6a. This ultrasonic oscillation voltage 6a is corrected in the same way as in the prior art; and using this corrected ultrasonic oscillation output, each bonding wire 31, 32, 33, . . . is bonded by the bonding tool 2 via the selected ultrasonic oscillation output which is suitable for the first bonding 41 and the second bonding 42.

FIG. 1(c) shows the case of the "correction timing pattern on bonding point" being selected. In this case, the respective correction initiation command signals 15a are outputted to the microcomputer 5 from the ultrasonic wave correction timing memory 15 prior to the initiation of the first bonding 41 and also prior to the initiation of the second bonding 42 to be done by each bonding wire 31, 32, 33, . . . Accordingly, the correction timing signal 5c is outputted in each case to the ultrasonic oscillation circuit 6 from the microcomputer 5, so that the ultrasonic oscillation circuit 6 outputs the ultrasonic oscillation voltage 6a. This ultrasonic oscillation voltage 6a is corrected in the same way as in the prior art. Then, the first bonding 41 and second bonding 42 are respectively accomplished using this corrected ultrasonic oscillation output.

Incidentally, the "correction timing pattern on bonding wire" and the "correction timing pattern on bonding point" tend to be used very often. Accordingly, these correction timing patterns are not desirable from the standpoint of productivity, and it is sufficient to select and use only the correction timing pattern on IC device.

However, if the wire bonding apparatus is switched on after a long period of non-use time, the relationship of the bonding apparatus with other cooperative apparatuses is not in an ideal condition. In this case, either the correction timing pattern on bonding wire or the correction timing pattern on bonding point is selected and used, and then switched to the correction timing pattern on IC device after an appropriate time period. Accordingly, it is enough to store, in the ultrasonic wave correction timing memory 15, the correction timing pattern on IC device and at least one of the other two correction timing patterns, i.e., the correction timing pattern on bonding wire or the correction timing pattern on bonding point.

As seen from the above, according to the present invention, a correction timing pattern in which a correction of ultrasonic oscillation output is performed prior to a first bonding by a first bonding wire in the bonding of one IC device, and at least one of two other correction timing patterns, i.e., a correction timing pattern in which a correction is performed prior to a first bonding by each bonding wire, or a third correction timing pattern in which respective corrections are performed prior to a first bonding and second bonding by each bonding wire, are stored beforehand in a memory. Accordingly, the ultrasonic oscillation output by the transducer can be automatically corrected by selecting one of the three correction timing patterns.

We claim:

1. A wire bonding method for integrated circuit devices in which an ultrasonic output is corrected so that differences in transducer characteristics are corrected for, said method comprising the steps of:

initially storing in memory a first correction timing pattern for each integrated circuit device by which the ultrasonic oscillation output is corrected prior to initiation of wire bonding to a first bonding point that is done by a first bonding wire on an integrated circuit device, a second correction timing pattern for each bonding wire by which the ultrasonic oscillation output is corrected prior to the initiation of wire bonding to a first bonding point by a bonding wire, and a third correction timing pattern for each bonding point by which the ultrasonic oscillation output is corrected prior to wire bonding to a first wire bonding point and prior to wire bonding to a second bonding point which are done by a bonding wire; and automatically correcting ultrasonic oscillation output by selecting one of said first, second or third correction timing patterns.

2. A wire bonding method for integrated circuit device in which ultrasonic output of a transducer is corrected, said method comprising the steps of:

storing three correction timing patterns in an ultrasonic wave correction timing memory, said three timing patterns comprising:

a first correction timing pattern for each integrated circuit device by which the ultrasonic oscillation output is corrected prior to the initiation of wire bonding to a first bonding point that is done by a first bonding wire on an integrated circuit device;

a second correction timing pattern for each bonding wire by which the ultrasonic oscillation output is corrected prior to the initiation of wire bonding to a first bonding point by a bonding wire; and a third correction timing pattern for each bonding point by which the ultrasonic oscillation output is corrected prior to wire bonding to a first bonding point and prior to wire bonding to a second bonding point which are done by a bonding wire;

selecting one of said first, second or third correcting timing patterns;

providing a correction initiation command signal, which is obtained based upon said selected one of said first, second or third timing patterns, to a computer; and providing a correction timing signal, which is obtained based upon said correction initiation command signal, to an ultrasonic oscillation control circuit that includes an ultrasonic oscillation circuit and an output control circuit which is connected to said transducer.

* * * * *